United States Patent
Liang et al.

(10) Patent No.: US 6,245,675 B1
(45) Date of Patent: Jun. 12, 2001

(54) 3D RESERVOIR TO IMPROVE ELECTROMIGRATION RESISTANCE OF TUNGSTEN PLUG

(75) Inventors: Mong-Song Liang, Hsin-Chu; Shau-Lin Shue, Hsinchu, both of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/489,966

(22) Filed: Jan. 24, 2000

(51) Int. Cl.⁷ .................. H01L 21/4763; H01L 21/44
(52) U.S. Cl. .................. 438/675; 438/622; 438/625; 438/629; 438/641; 438/674
(58) Field of Search .................. 438/688, 679, 438/674, 675, 641, 618, 622, 620, 625, 627, 629, 642, 648, 652, 656, 669

(56) References Cited

U.S. PATENT DOCUMENTS

| | | | |
|---|---|---|---|
| 5,506,450 | 4/1996 | Lee et al. | 257/767 |
| 5,654,216 | 8/1997 | Adrian | 438/627 |
| 5,760,477 | 6/1998 | Cronin | 257/767 |
| 5,793,113 * | 8/1998 | Oda | 257/774 |
| 5,834,369 | 11/1998 | Murakami et al. | 438/625 |
| 5,864,179 | 1/1999 | Koyama | 257/767 |
| 5,891,804 * | 6/1999 | Havemann et al. | 438/674 |
| 6,150,272 * | 11/2000 | Liu et al. | 438/692 |

FOREIGN PATENT DOCUMENTS

| | | |
|---|---|---|
| 8204005 * | 8/1996 | (JP). |
| 10229123 * | 2/1997 | (JP). |
| 10294317 * | 11/1998 | (JP). |

* cited by examiner

Primary Examiner—Charles Bowers
Assistant Examiner—T. Pham
(74) Attorney, Agent, or Firm—George O. Saile; Stephen B. Ackerman; Rosemary L. S. Pike

(57) ABSTRACT

A new method of metallization using a three-dimensional aluminum reservoir to increase the electromigration lifetime of a tungsten plug in the fabrication of integrated circuits is achieved. An insulating layer is provided covering semiconductor device structures in and on a semiconductor substrate. Aluminum lines are formed over the insulating layer. An intermetal dielectric layer is deposited overlying the aluminum lines. Via openings are made through the intermetal dielectric layer to the aluminum lines. Aluminum is selectively deposited into the via openings to form aluminum reservoirs in the bottom of the via openings wherein the aluminum does not completely fill the via openings. Tungsten plugs are formed within the via openings overlying the aluminum reservoirs wherein the aluminum reservoirs provide a source for electrons to replenish electrons lost through electromigration to complete formation of tungsten plug metallization with increased electromigration lifetime in the fabrication of integrated circuits.

15 Claims, 3 Drawing Sheets

Prior Art  Prior Art

3D RESERVOIR TO IMPROVE ELECTROMIGRATION RESISTANCE OF TUNGSTEN PLUG

BACKGROUND OF THE INVENTION (1) Field of the Invention

The invention relates to a method of metallization in the fabrication of integrated circuits, and more particularly, to a method of increasing the electromigration lifetime of a tungsten plug in the manufacture of integrated circuits.

(2) Description of the Prior Art

Performance and cost constantly drive attempts to design increased performance while simultaneously shrinking feature sizes, particularly in interconnects. An example of increased design performance is the addition of a reservoir to the cathode end of an interconnect to increase electromigration lifetime by relying on the well known dependence of electromigration average lifetime with reservoir area. U.S. Pat. No. 5,506,450 to Lee et al, U.S. Pat. No. 5,864,179 to Koyama, and U.S. Pat. No. 5,760,477 to Cronin disclose extended end portions of the top Aluminum line over the tungsten plug to act as an aluminum reservoir. U.S. Pat. No. 5,654,216 to Adrian teaches a double aluminum line over a tungsten plug. U.S. Pat. No. 5,834,369 to Murakami et al discloses a diffusion preventing film over a tungsten plug to allow for an alignment margin.

SUMMARY OF THE INVENTION

A principal object of the present invention is to provide an effective and very manufacturable method of forming an improved electromigration resistant tungsten plug metallization in the fabrication of integrated circuits.

Another object of the invention is to provide a three-dimensional aluminum reservoir to increase the electromigration lifetime of a tungsten plug in the fabrication of integrated circuits.

Yet another object is to provide a method of achieving electromigration resistance performance without decreasing chip density in the fabrication of integrated circuits.

A still further object of the invention is to provide a method of increasing chip density without decreasing electromigration resistance performance.

Yet another object of the invention is to provide a method of improving electromigration resistance performance of an unlanded via.

In accordance with the objects of this invention a new method of metallization using a three-dimensional aluminum reservoir to increase the electromigration lifetime of a tungsten plug in the fabrication of integrated circuits is achieved.

BRIEF DESCRIPTION OF THE DRAWINGS

In the accompanying drawings forming a material part of this description, there is shown.

DESCRIPTION OF THE PREFERRED EMBODIMENTS

Elecromigration failure results when too many electrons are lost from the tungsten plug without replenishment. This occurs when the landing area; that is the metal area underlying the via, is too small. It is desired to form an aluminum reservoir to act as a source of replenishment for electrons lost to electromigration.

Figures 1A, 1B:
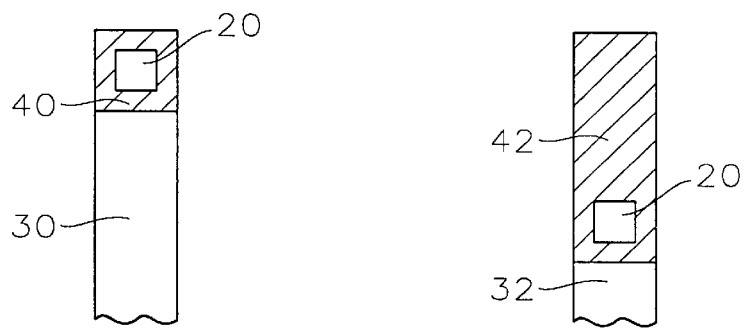
FIGS. 1A through 1C schematically illustrate top views of reservoir test structures.
Figure 1C:
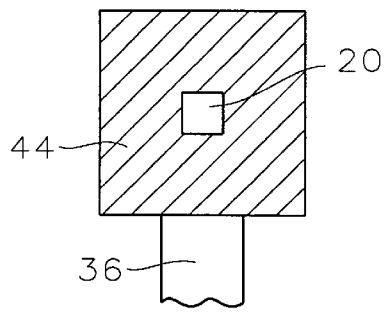

FIGS. 1A through 1C illustrate top views of aluminum reservoir test structures. The line width is 0.9 $\mu$m for all test structures shown. FIG. 1A illustrates a borderless via contact. Aluminum line 30 and tungsten plug 20 are shown. The reservoir area 40 in this structure is 0.63 $\mu m^2$. FIG. 1B illustrates another test structure having aluminum line 32, tungsten plug 20 and a reservoir area 42 of 1.30 $\mu m^2$. Fig 1C illustrates aluminum line 36 and tungsten plug 20 having a reservoir area 44 of 5.76 $\mu m^2$. The larger the reservoir, the better the electromigration resistance. However, using structures 1B or 1C to improve electromigration requires sacrificing the density of the layout.

The present invention provides a method for forming an aluminum reservoir which will increase electromigration lifetime, but will not decrease chip density. The aluminum reservoir is formed in a portion of the via underlying the tungsten plug. Thus, a structure as small as that shown in FIG. 1A can be used in the process of the invention to improve electromigration resistance without sacrificing layout density.

The process for forming the novel reservoir of the present invention will be described with reference to FIGS. 2 through 6.

Figure 2:
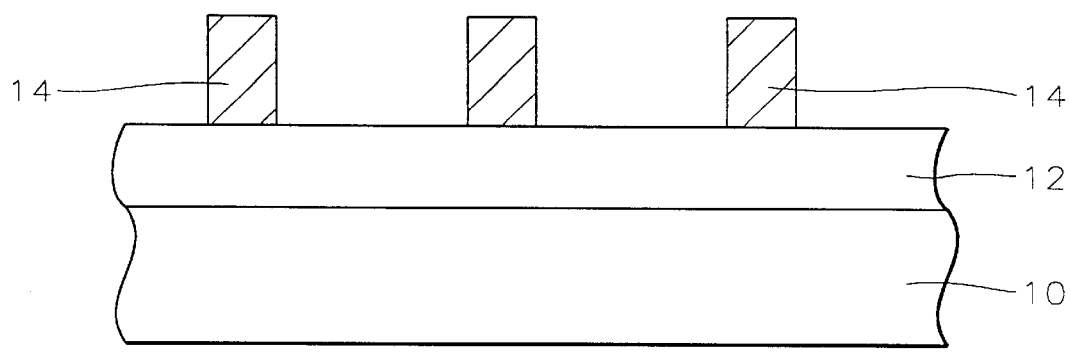
FIGS. 2 through 6 schematically illustrate in cross-sectional representation a preferred embodiment of the present invention.

Referring now more particularly to FIG. 2, there is illustrated a portion of a partially completed integrated circuit. There is shown a semiconductor substrate 10, preferably composed of monocrystalline silicon. Semiconductor device structures, including, for example, gate electrodes and associated source and drain regions and subsequent levels of metallization with intervening dielectric layers are formed in and on the semiconductor substrate. All of these structures, not shown, are represented by layer 12.

Now, metal lines 14 are patterned over the surface of the substrate. The metal lines are preferably aluminum or an aluminum alloy. The metal lines 14 are patterned with a highest density rule.

Figure 3:
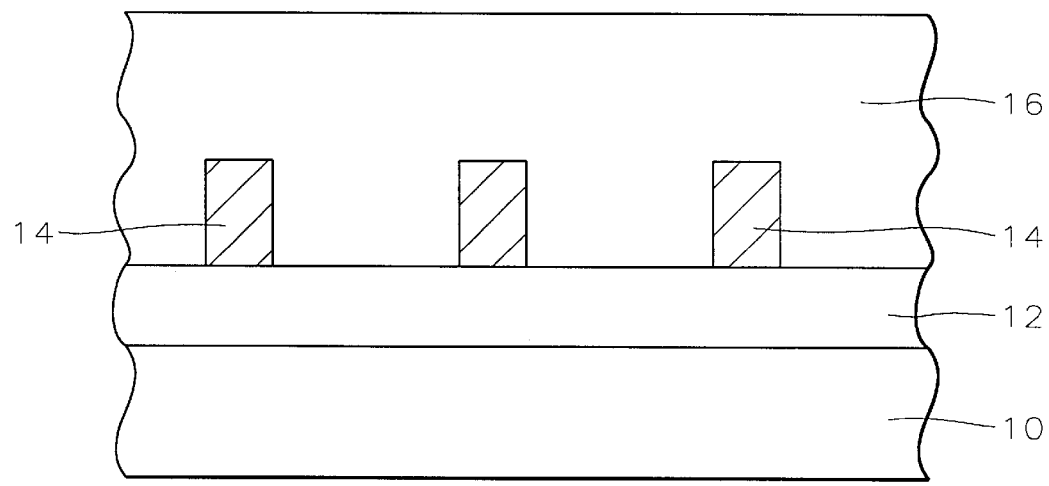
Figure 4:
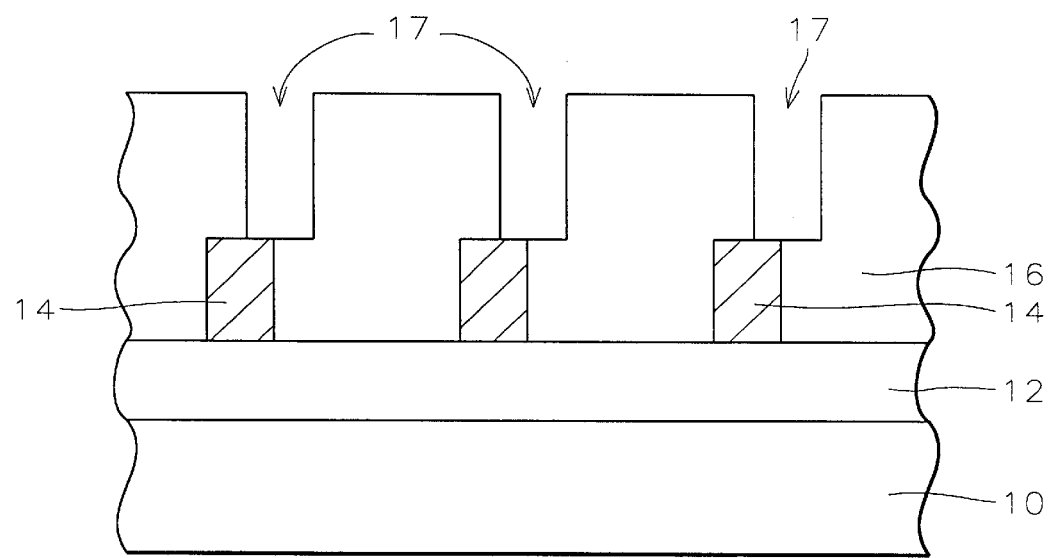

An intermetal dielectric layer 16 is deposited over the metal lines, as shown in FIG. 3. Via openings 17 are made through the dielectric layer 16 to contact the underlying aluminum lines 14. A misalignment of the via pattern is shown in FIG. 4. This misalignment will not cause a problem. The via openings have a depth of between about 7000 and 8000 Angstroms.

Figure 5:
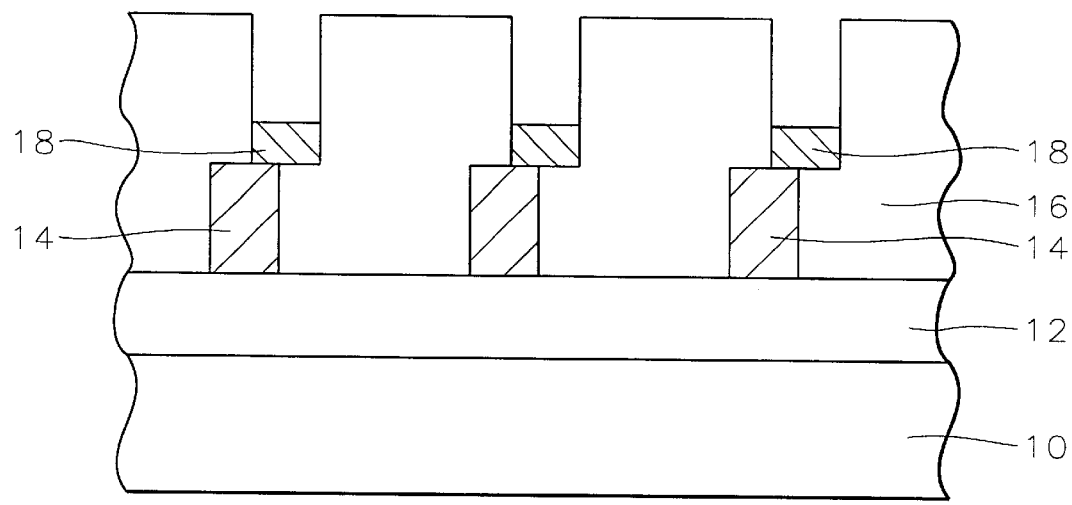

Now, referring to FIG. 5, aluminum is selectively deposited into the via openings 17 to form a reservoir 18 having a thickness of between about 1000 and 2000 Angstroms. The aluminum is deposited by a hot-cold method or by a reflow physical vapor deposition (PVD) process. In the hot-cold method, a seed layer of aluminum is deposited at a low temperature. The bulk of the aluminum then is deposited at a higher temperature, above 450° C.

Figure 6:
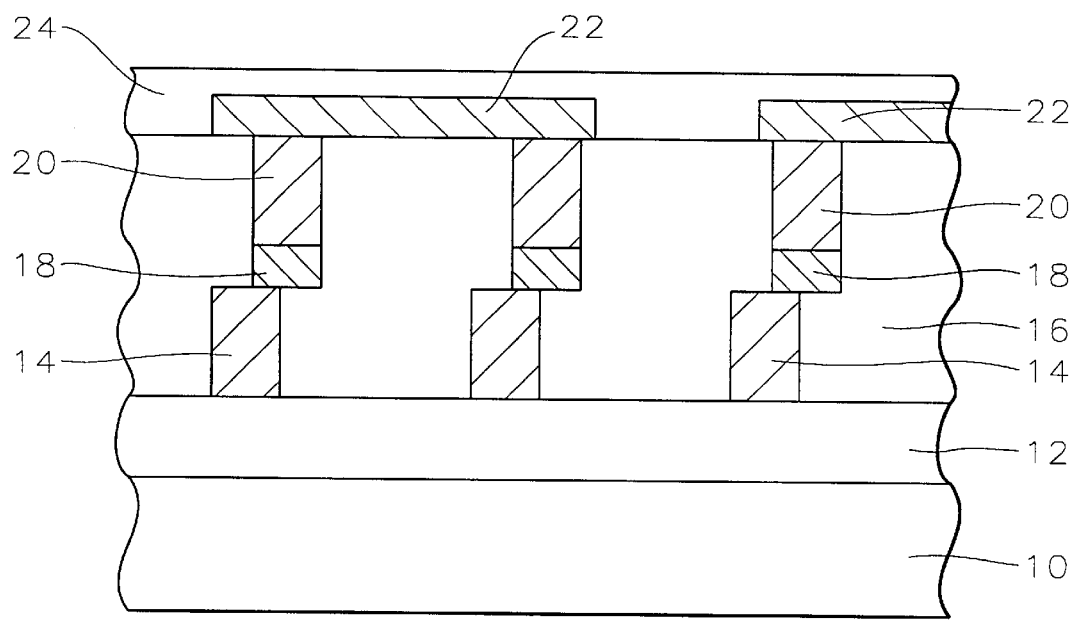

Now, a tungsten plug 20 is formed within the via openings over the aluminum reservoirs 18, as shown in FIG. 6. The tungsten plug formation, by tungsten deposition and chemical mechanical polishing (CMP), for example, is conventional. Another set of patterned aluminum lines 22 may now be fabricated overlying the tungsten plugs, as shown. This is followed by another dielectric layer deposition 24.

It will be understood by those skilled in the art that a number of steps have been omitted from the description in order to simplify the process. For example, aluminum lines 14 and 22 may comprise a multi-layer stack, including, for example, barrier layers and antireflective coating layers. Likewise, tungsten plug 20 may have an underlying glue and/or barrier layer formed within the via opening.

The process of the present invention provides a method for forming an aluminum reservoir for increasing electromigration lifetime. Since the reservoir is formed at the bottom of the tungsten plug via opening, no additional space is required for the reservoir, thus maintaining high chip density. The aluminum reservoir underlying the tungsten plug provides a source for electrons to replenish those lost to electromigration thus preventing holes within the tungsten plug. Aluminum reservoirs according to the process of the invention may be formed at any or all levels of tungsten plug metallization, as needed.

While the invention has been particularly shown and described with reference to the preferred embodiments thereof, it will be understood by those skilled in the art that various changes in form and details may be made without departing from the spirit and scope of the invention.

What is claimed is:

1. A method of forming tungsten plug metallization in the fabrication of integrated circuits comprising:
   providing an insulating layer covering semiconductor device structures in and on a semiconductor substrate;
   forming metal lines over said insulating layer;
   depositing an intermetal dielectric layer overlying said metal lines;
   opening via openings through said intermetal dielectric layer to said metal lines;
   selectively depositing aluminum into said via openings to form aluminum reservoirs in the bottom of said via openings wherein said aluminum does not completely fill said via openings; and
   forming tungsten plugs within said via openings overlying said aluminum reservoirs to complete said formation of said tungsten plug metallization in said fabrication of said integrated circuit,
   wherein said aluminum reservoirs provide a source for electrons to replenish electron lost through electromigration.

2. The method according to claim 1 wherein said metal lines comprises aluminum.

3. The method according to claim 1 wherein said step of selectively depositing said aluminum comprises:
   depositing an aluminum seed layer within said via openings at a first temperature; and
   thereafter depositing an aluminum layer on said aluminum seed layer at a second temperature higher than said first temperature.

4. The method according to claim 1 wherein said step of selectively depositing said aluminum comprises:
   depositing an aluminum layer within said via openings by physical vapor deposition; and
   thereafter reflowing said aluminum layer whereby said aluminum layer fills said via openings.

5. The method according to claim 1 wherein said via openings have a depth of between about 7000 and 8000 Angstroms and wherein said aluminum reservoirs have a thickness of between about 1000 and 2000 Angstroms.

6. The method according to claim 1 further comprising:
   forming second metal lines overlying said tungsten plugs; and
   depositing a second insulating layer overlying said second metal lines.

7. A method of forming tungsten plug metallization while increasing electromigration lifetime in the fabrication of integrated circuits comprising:
   providing an insulating layer covering semiconductor device structures in and on a semiconductor substrate;
   forming aluminum lines over said insulating layer;
   depositing an intermetal dielectric layer overlying said aluminum lines;
   opening via openings through said intermetal dielectric layer to said aluminum lines;
   selectively depositing aluminum into said via openings to form aluminum reservoirs in the bottom of said via openings wherein said aluminum does not completely fill said via openings; and
   forming tungsten plugs within said via openings overlying said aluminum reservoirs wherein said aluminum reservoirs provide a source for electrons to replenish electrons lost through electromigration to complete said formation of said tungsten plug metallization with increased electromigration lifetime in said fabrication of said integrated circuit.

8. The method according to claim 7 wherein said step of selectively depositing said aluminum comprises:
   depositing an aluminum seed layer within said via openings at a first temperature; and
   thereafter depositing an aluminum layer on said aluminum seed layer at a second temperature higher than said first temperature.

9. The method according to claim 7 wherein said step of selectively depositing said aluminum comprises:
   depositing an aluminum layer within said via openings by physical vapor deposition; and
   thereafter reflowing said aluminum layer whereby said aluminum layer fills said via openings.

10. The method according to claim 7 wherein said via openings have a depth of between about 7000 and 8000 Angstroms and wherein said aluminum reservoirs have a thickness of between about 1000 and 2000 Angstroms.

11. The method according to claim 7 further comprising:
    forming second metal lines overlying said tungsten plugs; and
    depositing a second insulating layer overlying said second metal lines.

12. A method of forming tungsten plug metallization while increasing electromigration lifetime in the fabrication of integrated circuits comprising:
    providing an insulating layer covering semiconductor device structures in and on a semiconductor substrate;
    forming aluminum lines over said insulating layer;
    depositing an intermetal dielectric layer overlying said aluminum lines;
    opening via openings through said intermetal dielectric layer to said aluminum lines;
    selectively depositing aluminum into said via openings to form aluminum reservoirs in the bottom of said via openings wherein said aluminum does not completely fill said via openings;
    forming tungsten plugs within said via openings overlying said aluminum reservoirs wherein said aluminum reservoirs provide a source for electrons to replenish electrons lost through electromigration;
    forming second aluminum lines overlying said tungsten plugs; and depositing a second insulating layer overlying said second aluminum lines to complete said formation of said tungsten plug metallization with increased electromigration lifetime in said fabrication of said integrated circuit.

13. The method according to claim 12 wherein said step of selectively depositing said aluminum comprises:

depositing an aluminum seed layer within said via openings at a first temperature; and thereafter depositing an aluminum layer on said aluminum seed layer at a second temperature higher than said first temperature.

14. The method according to claim 12 wherein said step of selectively depositing said aluminum comprises:

depositing an aluminum layer within said via openings by physical vapor deposition; and thereafter reflowing said aluminum layer whereby said aluminum layer fills said via openings.

15. The method according to claim 12 wherein said via openings have a depth of between about 7000 and 8000 Angstroms and wherein said aluminum reservoirs have a thickness of between about 1000 and 2000 Angstroms.

* * * * *